US011334786B2

(12) United States Patent
Buyuktosunoglu et al.

(10) Patent No.: US 11,334,786 B2
(45) Date of Patent: May 17, 2022

(54) SYSTEM AND METHOD FOR AN ERROR-AWARE RUNTIME CONFIGURABLE MEMORY HIERARCHY FOR IMPROVED ENERGY EFFICIENCY

(71) Applicant: International Business Machines Corporation, Armonk, NY (US)

(72) Inventors: Alper Buyuktosunoglu, White Plains, NY (US); Nandhini Chandramoorthy, Yorktown Heights, NY (US); Prashant Jayaprakash Nair, Elmsford, NY (US); Karthik V. Swaminathan, Mount Kisco, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 664 days.

(21) Appl. No.: 16/394,272

(22) Filed: Apr. 25, 2019

(65) Prior Publication Data
US 2020/0342284 A1    Oct. 29, 2020

(51) Int. Cl.
*G06F 3/06*    (2006.01)
*G06N 3/02*    (2006.01)

(52) U.S. Cl.
CPC ............ *G06N 3/02* (2013.01); *G06F 3/0619* (2013.01); *G06F 3/0653* (2013.01); *G06F 3/0673* (2013.01)

(58) Field of Classification Search
None
See application file for complete search history.

(56) References Cited

U.S. PATENT DOCUMENTS 8,861,270 B2   10/2014   Strauss et al.
9,552,862 B2    1/2017   Ohki et al.
(Continued)

FOREIGN PATENT DOCUMENTS

WO    WO 2017/151567 A1    9/2017

OTHER PUBLICATIONS

Mel, et al. "The NIST Definition of Cloud Computing". Recommendations of the National Institute of Standards and Technology. Nov. 16, 2015.
(Continued)

*Primary Examiner* — Scott C Sun
(74) *Attorney, Agent, or Firm* — Joseph Petrokaitis, Esq.; McGinn I.P. Law Group, PLLC.

(57) ABSTRACT

A method (and structure and computer product) to optimize an operation in a Neural Network Accelerator (NNAccel) that includes a hierarchy of neural network layers as computational stages for the NNAccel and a configurable hierarchy of memory modules including one or more on-chip Static Random-Access Memory (SRAM) modules and one or more Dynamic Random-Access Memory (DRAM) modules, where each memory module is controlled by a plurality of operational parameters that are adjustable by a controller of the NNAcc. The method includes detecting bit error rates of memory modules currently being used by the NNAccel and determining, by the controller, whether the detected bit error rates are sufficient for a predetermined threshold value for an accuracy of a processing of the NNAccel. One or more operational parameters of one or more memory modules are dynamically changed by the controller to move to a higher accuracy state when the accuracy is below the predetermined threshold value.

20 Claims, 9 Drawing Sheets

(56) References Cited

U.S. PATENT DOCUMENTS

| | | |
|---|---|---|
| 9,690,656 B2 | 6/2017 | Strauss et al. |
| 9,785,220 B2 | 10/2017 | Eltawil et al. |
| 9,846,613 B2 | 12/2017 | Arslan et al. |
| 2015/0331732 A1 | 11/2015 | Giovannini et al. |
| 2018/0121796 A1* | 5/2018 | Deisher ................ G06N 3/0472 |
| 2020/0342291 A1* | 10/2020 | Croxford ............. G06N 3/0454 |

OTHER PUBLICATIONS

Song Liu, et al., "Flikker: Saving DRAM Refresh-Power Through Critical Data Partitioning", ASPLOS'11, Mar. 5-11, 2011, Newport Beach, CA.

* cited by examiner

SYSTEM AND METHOD FOR AN ERROR-AWARE RUNTIME CONFIGURABLE MEMORY HIERARCHY FOR IMPROVED ENERGY EFFICIENCY

BACKGROUND

The present invention relates generally to Neural Network Accelerators (NNAccels). More specifically, an error control unit uses error profiles associated with an accelerator to determine settings for tunable parameters of the memory devices as a dynamic closed loop control system to optimize performance, as measured by overall energy consumption, subject to quality, as measured by accuracy.

SUMMARY

Distributed edge computing includes any type of computing that pushes applications, data, and computing power away from centralized points to locations closer to the user, thereby delivering low latency nearer to requests. For example, in Internet of Things (IoT) devices, data comes in from the physical world via various sensors and actions are taken to change a state via various forms of output and actuators. By performing analytics and knowledge generation at the edge, communications bandwidth between systems under control and the central data center is reduced.

In this paradigm of distributed edge computing, the computational load on the edge device has significantly increased, particularly in the cognitive IoT domain. In the context of the present invention, the term "cognitive" is intended as referring to an application for which a neural network is used for execution, such that a neural network accelerator could be of benefit in implementing the neural network functions. Most state-of-the-art cognitive accelerator hardware is expected to process complex, multi-layer deep neural networks (DNNs) such as AlexNet, ResNet, and other complex convolutional neural networks (CNNs). These networks have large memory requirements, often in the order of tens of megabytes (MB).

In most cases it may not be practical to design chips with such large on-chip Static Random-Access Memory (SRAMs) in a monolithic manner. This leads to a memory hierarchy of one or more levels of different memory types and different capacities, such as on-chip SRAMs of the order of tens to hundreds of kilobytes (KB) and Dynamic Random-Access Memory (DRAM) of the order of tens of MBs. These memories have different actuation knobs which tradeoff between reliability, which affects output accuracy, and performance and power, which affect energy.

The present invention discloses a closed-loop, runtime configurable technique to optimize the energy of the entire memory hierarchy while maintaining target accuracy.

In accordance with an exemplary embodiment, the present invention discloses a method (and apparatus and computer product) to optimize an operation in a Neural Network Accelerator (NNAccel) that includes a hierarchy of neural network layers as computational stages for the NNAccel and a configurable hierarchy of memory modules including one or more on-chip Static Random-Access Memory (SRAM) modules and one or more Dynamic Random-Access Memory (DRAM) modules, each memory module controlled by a plurality of operational parameters that are adjustable by a controller of the NNAcc. The method includes: detecting bit error rates of memory modules currently being used by the NNAccel; determining, by the controller, whether the detected bit error rates are sufficient for a predetermined threshold value for an accuracy of a processing of the NNAccel; and dynamically changing, by the controller, one or more operational parameters of one or more memory modules to move to a higher accuracy state when the accuracy is below the predetermined threshold value.

In accordance with another exemplary embodiment, also disclosed herein is a neural network accelerator (NNAccel) including a hierarchy of neural network layers as comprising computational stages for the NNAccel; and a configurable hierarchy of memory modules including one or more on-chip Static Random-Access Memory (SRAM) modules and one or more Dynamic Random-Access Memory (DRAM) modules, each memory module controlled by a plurality of operational parameters that are adjustable by a controller of the NNAcc. The controller controls the NNAccel by a control method that includes: detecting bit error rates of memory modules currently being used by the NNAccel; determining, by the controller, whether the detected bit error rates are sufficient to provide a predetermined threshold value an accuracy of a processing of the NNAccel; and dynamically changing, by the controller, one or more operational parameters of one or more memory modules to move to a higher accuracy state when the accuracy is below the predetermined threshold value.

In accordance with yet an exemplary embodiment, also disclosed herein is a method of controlling an operation in a Neural Network Accelerator (NNAccel) comprising a hierarchy of neural network layers as computational stages for the NNAccel and a configurable hierarchy of memory modules including one or more on-chip Static Random-Access Memory (SRAM) modules and one or more Dynamic Random-Access Memory (DRAM) modules, each memory module controlled by a plurality of operational parameters that are adjustable by a controller of the NNAcc. The method includes: detecting a current value of a parameter reflecting a quality of a processing in the NNAccel; determining, by the controller, whether the quality is currently sufficient for a predetermined threshold quality; and dynamically changing, by the controller, one or more operational parameters to move to a higher quality state when the quality is below the predetermined threshold value.

DETAILED DESCRIPTION

Figure 1:
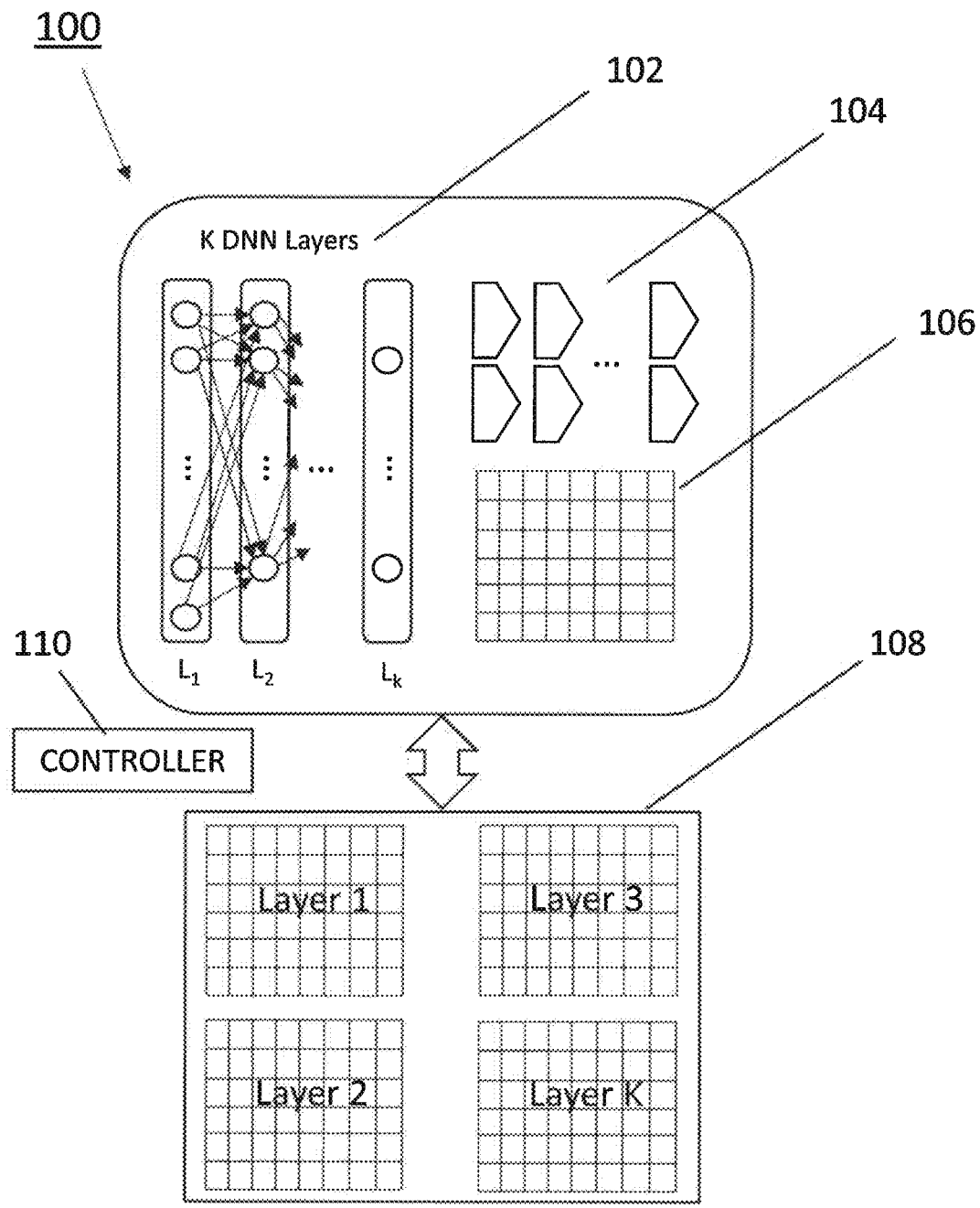
FIG. 1 exemplarily shows a DNN with tunable parameters to explain the present invention.

To explain concepts of the present invention, FIG. 1 exemplarily shows a DNN accelerator system 100 with a hierarchy of memory modules, comprising one or more SRAM (Ms) modules 106 and one or more DRAM (MD) modules 108, each of which has multiple tunable knobs (voltage, latency, refresh rate, etc.) that can trade off increased bit error rates for energy savings. Accelerator controller 110 implements a process of alternating stages of computation and memory access that respectively involve input data brought in from remote memory 108 to local memory 106, for the memory access stage, and (a) on-chip compute elements 104, such as multiply-accumulate units 104 and (b) a model defined by the weights and biases of DNN layers 102, for the computation stage. In the present invention, in addition to controlling the memory access and computation stages, controller 110 also implements an iterative feedback loop mechanism where the overall output quality metric, such as inference accuracy in case of DNN applications, is dynamically used to tune the operating knobs for each level of memory hierarchy 106, 108.

The controller 110 shown in the exemplary embodiment could be a microcontroller or a processor. More general to the exemplary embodiment shown in FIG. 1, accelerators could either have a dedicated memory controller such as controller 110, or, in other configurations, an associated Central Processing Unit (CPU) dedicated to control-path operations will control the operations of the accelerator, including an exemplary configuration involving an associated CPU in a host computer that is implementing functions other host computer functions in addition to managing the accelerator system 100.

In the context of the present invention, the term "tunable knob" or "operating knob" refers to a capacity to adjust one or more settings for the memory modules 106, 108, as accessible by, for example, the accelerator controller 110 implementing the feedback loop of the present invention. It is further noted that the DNN 102 could be implemented as a "wired" hardware component or could be implemented using other mechanisms, such as, for example a Field Programmable Gate Array (FPGA).

Very-Low-Voltage (VLV) Operation of Neural Network Accelerators

Figure 2:
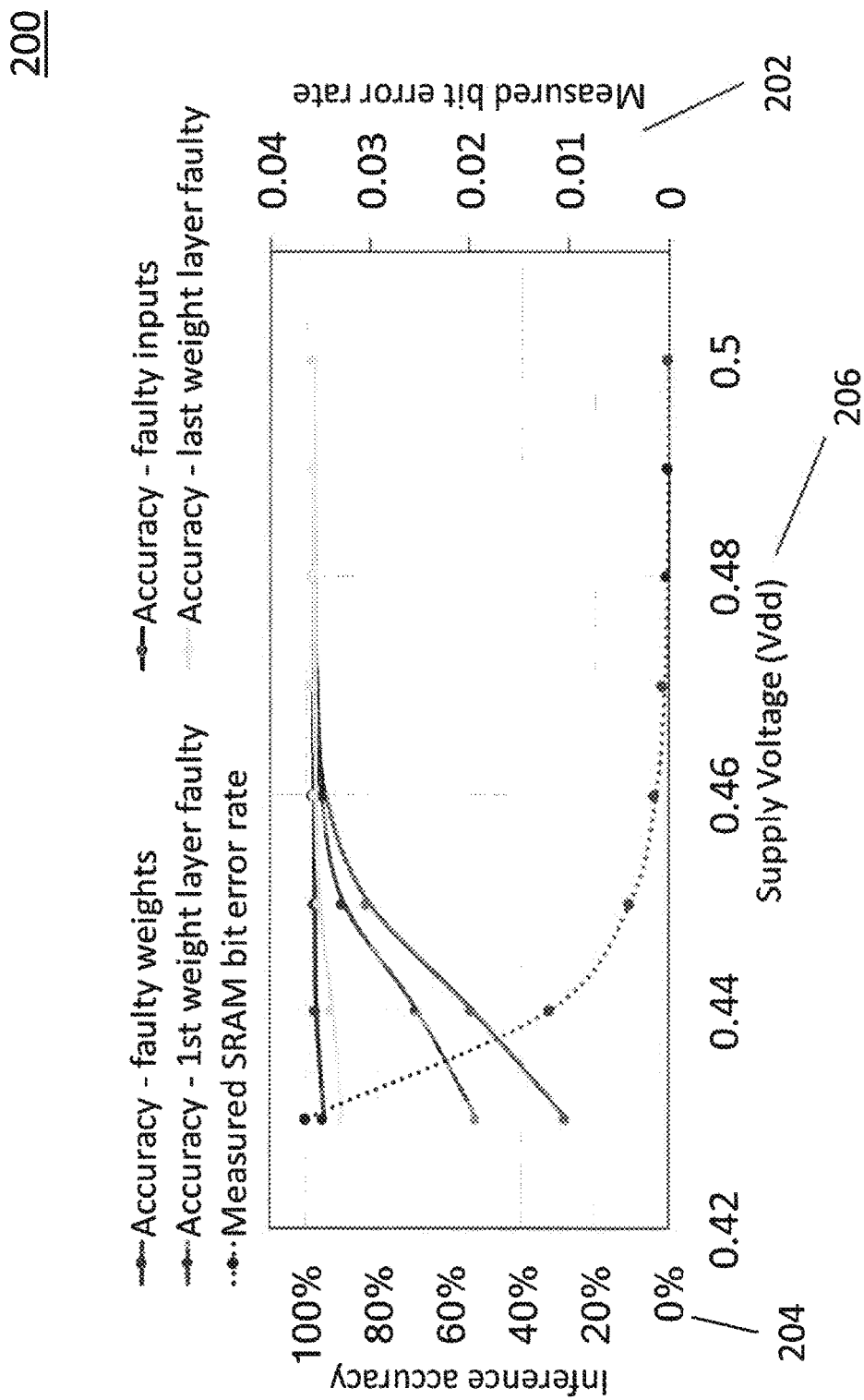
FIG. 2 exemplarily demonstrates the concept of inference accuracy.

Although reducing the voltage V in a memory module can result in significant energy savings of an order of $V^2$, such reduced voltage can lead to the introduction of bit errors in memory read and write operations, as exemplarily shown in the error sensitivity plot 200 shown in FIG. 2, as well as changes in the model of the DNN layers 102. Such changes in the model configuration or inputs stored on-chip due to these bit errors 202 may reduce the overall inference accuracy 204.

The term "inference accuracy" is well known in the art as referring to the average percentage of accelerator outputs that match the ground truth, where "ground truth" means information that is known to be correct with certainty. Inference accuracy is established by testing the accelerator on a validation dataset where the ground truth is known, and this inference accuracy information is presumed for purpose of explaining the present invention.

The present invention is based on recognizing that it is possible to tune memory module 106, 108 settings, such as the operating voltage 206, to ensure an inference accuracy 204 above a target threshold, even in the presence of errors. These errors 202 can occur in either SRAM 106 or DRAM 108 or both. In a preferred exemplary embodiment, bit error rates are monitored cumulatively over all currently-active memory modules. Different layers of the neural network 102 can have different degrees of error tolerance, as shown exemplarily in FIG. 2, thereby permitting the inference accuracy to be ascertained. Very low voltage SRAM operation in DNN accelerators relative to error rate has been examined in prior art references, as shown by the dotted line in FIG. 2.

The present invention focuses on error-aware operation of a memory hierarchy comprising one or more levels both of static and dynamic RAM. A technique is described herein in which the bit error information from one level of memory hierarchy can, for example, be used to dynamically adjust the operating voltage of the subsequent level in order to simultaneously maximize energy efficiency without comprising on overall accuracy.

Figure 3:
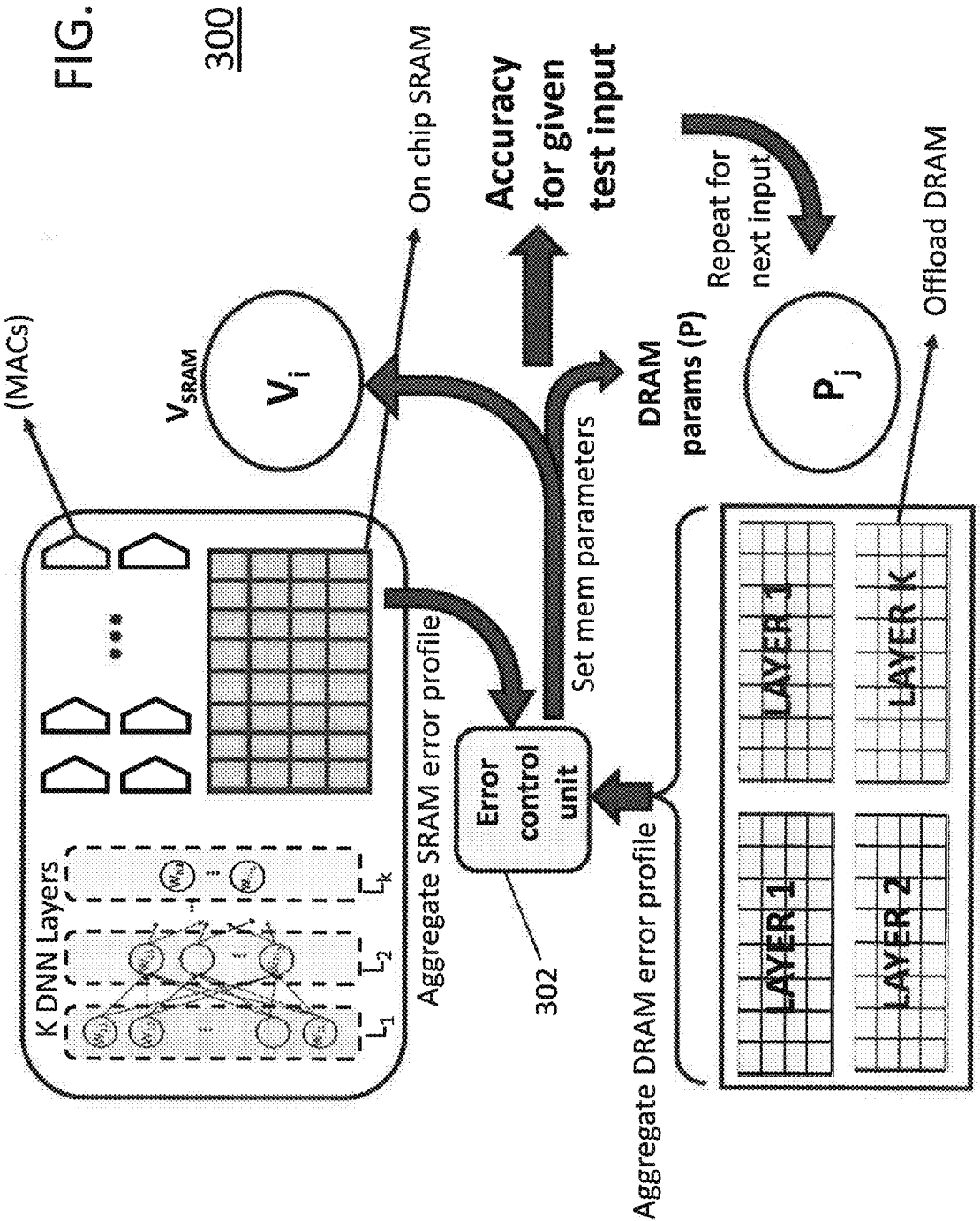
FIG. 3 shows an exemplary embodiment of the present invention.

Thus, as shown in FIG. 3, an exemplary embodiment of the present invention includes a DNN accelerator 300 with an on-chip SRAM cache and Offload (i.e., off-chip) DRAM and a dynamic control loop for DRAM (MD) and SRAM (Ms) operating parameters. However, it is noted that the DRAM need not be off-chip, since the present invention also provides a control mechanism that is applicable if all memory devices are on-chip or off-chip, or partially on-chip and partially off-chip.

The accelerator controller (not shown in FIG. 3) includes an error control unit 302 that receives indication of errors in the DRAM and SRAM memory modules using, for example, a mechanism such as counting error correction code (ECC) instances in the memory units at current memory module settings. Although ECC is used in an exemplary embodiment of the present invention, it is noted that there are various different ECC mechanisms such as, for example, Single Error Correction and Double Error Detection (SECDED), Double Error Correcting, Triple Error Detecting (DECTED) etc., as well as other error detection/correction mechanisms such as parity and Built-In-Self-Test (BIST), that could be used as a monitor mechanism for the present invention. Moreover, although the exemplary embodiment in FIG. 3 uses ECC or other error detection mechanism, the present invention should be understood more generally as using any mechanism by which accuracy (or other parameter indicative of quality) can be detected in a closed loop feedback system involving at least one parameter that can be adjusted and which at least one parameter would potentially affect accuracy (or other parameter indicative of quality).

Tunable $M_D$ parameters {P} include, for example:
Voltage (V)
Frequency (f)
Latency (L)
Refresh Rate (R)
Tunable $M_s$ parameters include, for example:
Voltage (V)
Frequency (f)

The control loop of the present invention utilizes a combination of offline pruning and dynamic runtime reconfiguration of above parameters. Actuation granularity may be on a per layer basis (e.g., when each layer is brought into SRAM from DRAM) or on a per test input basis (e.g., for each input from a test dataset, once final accuracy is computed).

Figure 4:
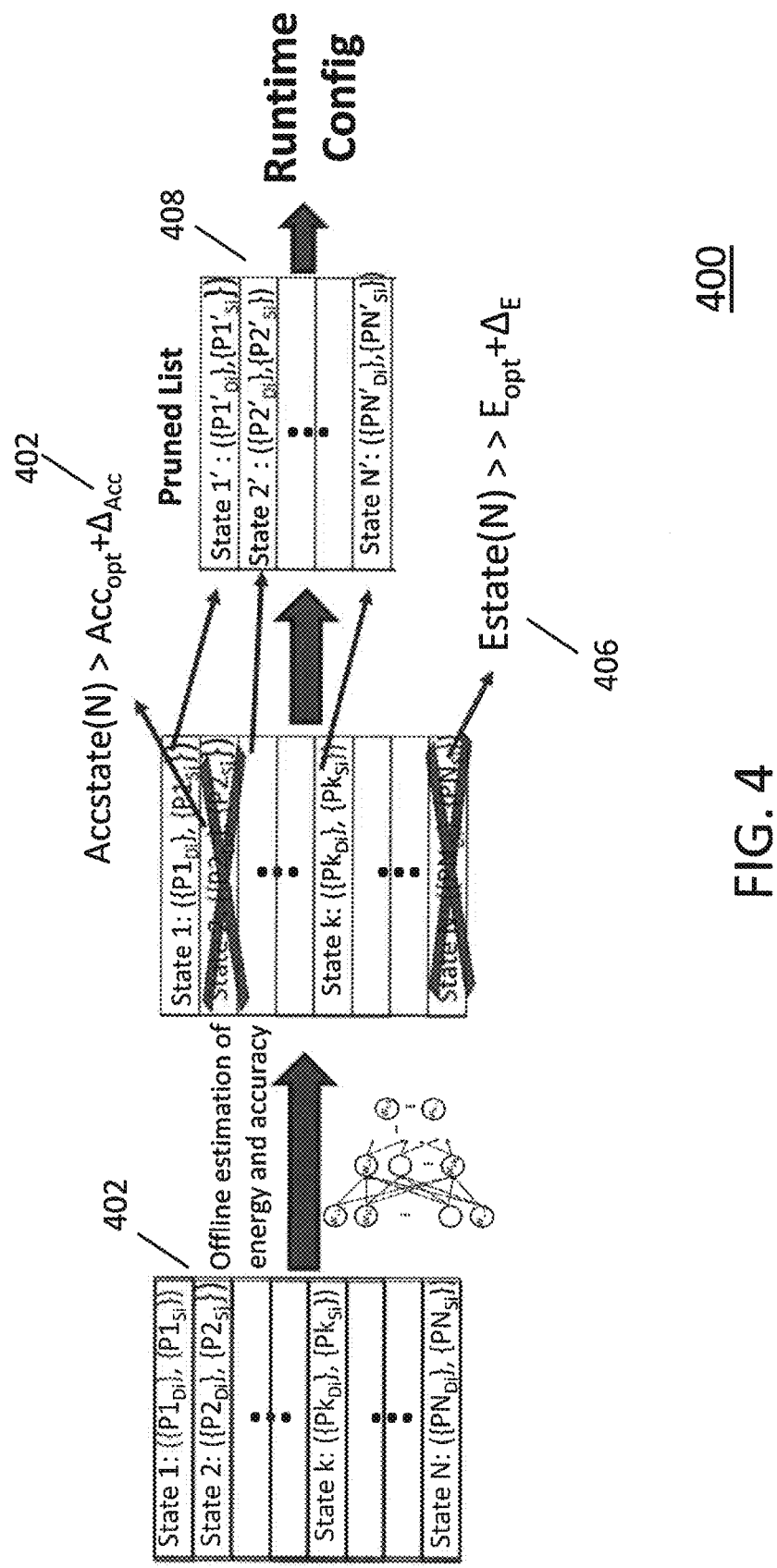
FIG. 4 demonstrates the static (offline) state space exploration and pruning to arrive at a runtime configuration.

FIG. 4 shows an example of the offline pruning process 400 in which possible states 402 of parameter settings are analyzed either analytically or experimentally in offline scenarios involving combinations of different setting values for different parameters. As exemplarily shown in FIG. 4, those configuration states 404, 406 whose energy or accuracy values do not fall within a prescribed threshold are eliminated or pruned. An exemplary threshold can be defined as follows ($E_{state(i)} > E_{opt} + \Delta_E$ OR $Acc_{State(i)} < Acc_{opt} + \Delta_{Acc}$), where:

$E_{state(i)}$ is the overall energy of the accelerator system, $E_{opt}$ is a predetermined optimal overall energy, $Acc_{State(i)}$ is the overall accuracy of the system at state(i), and $Acc_{opt}$ is a predetermined optimal overall accuracy.

The determination of optimal accuracy and/or energy is dependent upon specific applications that an accelerator will execute. For example, optimal accuracy could be defined by the user depending on the application requirements. Energy might be defined, for example, in terms of overall energy consumption of the NNAccel, expected battery lifetime, average ambient energy, in case of batteryless (e.g., solar powered) systems, number of memory modules permitted to operate concurrently before voltage of a power supply drops below a predetermined minimal voltage, or maximum clock speed before energy consumption causes an undesired voltage drop.

The states 408 that remain after pruning constitute the runtime configuration listing of the accelerator system, as stored in a nonvolatile memory in the accelerator and as accessible to the accelerator controller. It should be noted that, in addition to storing the specific parameter values used to establish the different possible state combinations, each of the possible states(i) would be associated with a quantitative value for energy(i) and accuracy(i), so that the resultant runtime configuration states 408 can then be sorted and stored as a listing of states with increasing accuracy and states of increasing energy efficiency, which permits the closed loop feedback system of the present invention to easily advance or retreat from different states of accuracy and from different states of energy efficiency. It is also noted that it is not necessary to consider all possible combinations of parameter values in the pruning stage since the method can be done with a relatively small number of possible states in the runtime configuration states, given that the accelerator system could always be operated at a highest accuracy using a highest permitted energy.

It is further noted that it would be possible to use the method of the invention without initially pruning the possible states, for example, by merely letting the feedback loop establish a state that appropriately ends up in a state that satisfies first accuracy and then satisfies overall power consumption. However, using the system without the initial pruning would typically not be desirable because of the time that would be required for convergence to a stable operating state.

Figure 5:
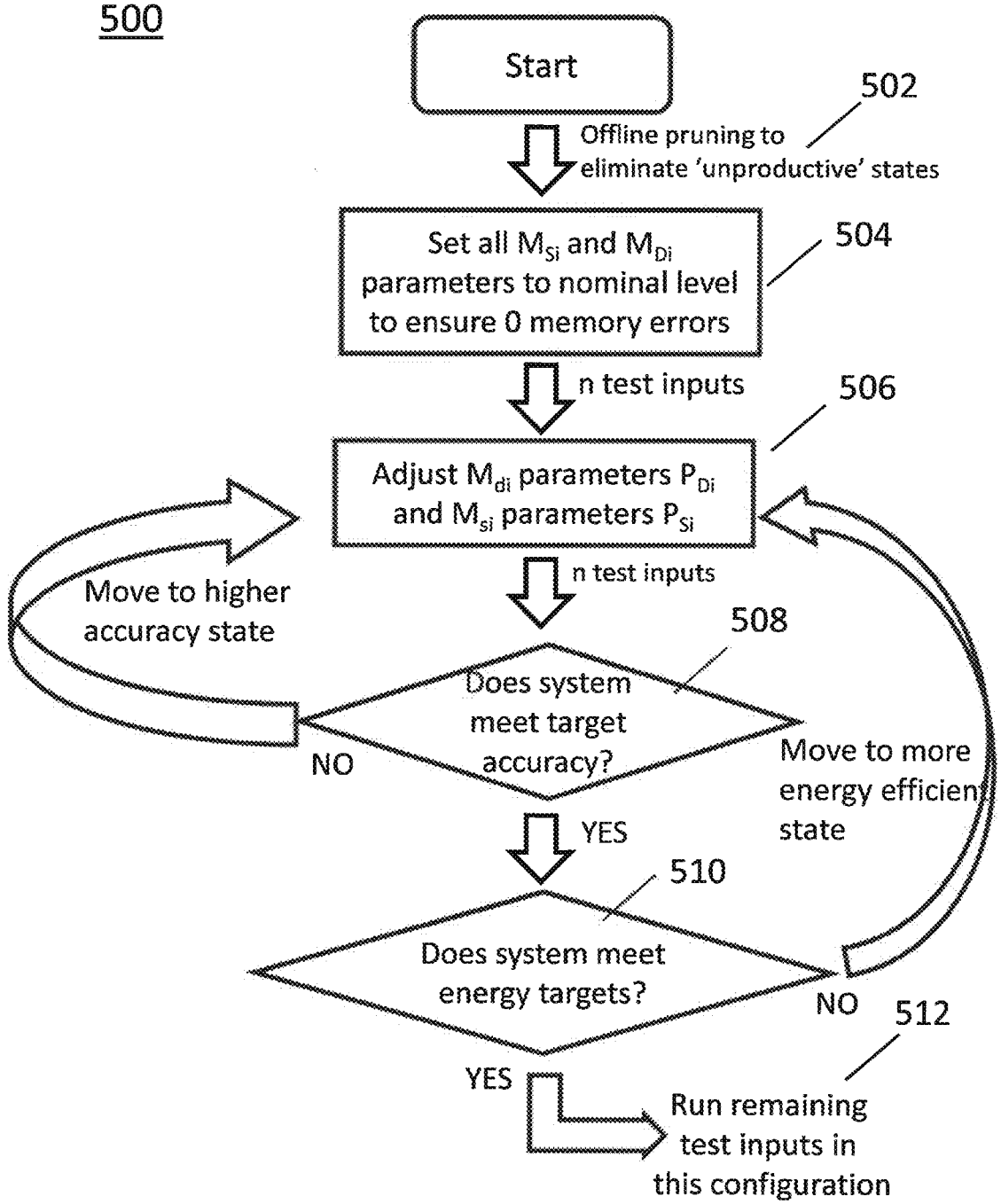
FIG. 5 shows a flowchart of an exemplary embodiment of the present invention.

FIG. 5 is a flowchart 500 of an exemplary method of the present invention, including the initial offline step 502 of pruning, as exemplarily explained in reference to FIG. 4, as determining which parameter combinations would cause either overall energy of the accelerator system to exceed the predetermined energy consumption threshold level or fails to meet the predetermined accuracy level.

The pruning process and the determination of unproductive states can be implemented in various ways, but a straightforward manner would be to start with the error sensitivity data such as exemplarily shown in FIG. 2, and decide the minimal acceptable accuracy for the accelerator along with the supply voltage required to achieve at least this accuracy. Once the threshold accuracy and voltage levels are determined, the pruning process would then eliminate states in which voltage falls below the voltage threshold level due to, for example, adding too many memory modules to the current memory configuration of the accelerator that might cause a power supply voltage drop that inadvertently affects accuracy by falling below the voltage threshold level or attempting to operate the accelerator at a speed that would inadvertently cause power supply voltage to drop below the voltage threshold required for accuracy. Other unproductive states might include, for example, eliminating some states that are possible in the system so as to retain only a limited number of possible states rather than having a virtually infinite number of possible states based on changing a parameter's value by essentially infinitesimal amounts.

In step 504, the accelerator's settings are initially set to nominal levels that ensures zero memory errors. By providing data as test inputs, the setting values are then adjusted in a dynamic closed loop in steps 506, 508, 510 until both accuracy and energy targets are satisfied in step 512, as arriving at a configuration appropriate to continue without further adjustments until sufficient bit error rate is detected to cause further adjustment of parameter values due to, for example, changes in the input data to be processed. Inputting the test inputs can be initially done automatically where the first n out of N inputs, for example 5-10% of the total inputs, are used to determine the optimal operating state for the inputs remaining.

As shown in FIG. 5, in this exemplary embodiment, accuracy is more important than energy consumption in the accelerator operation because a desired accuracy is first established, after which the close loop will search for a lower energy consumption. As the closed loop searches for an acceptable energy rate, it will change states with less energy efficiency until it encounters an energy state that causes accuracy to become unacceptable, thereby moving back to a more energy efficient state that permits accuracy to fall back to an acceptable accuracy. It should also be clear from FIG. 5 that a desired accuracy and a desired energy consumption can both be stably achieved, and the accelerator can operate in that state until an excessive error rate is detected to cause the closed loop to again search for a state that satisfies both an acceptable accuracy and an acceptable energy consumption, by moving to a more energy efficient state.

The exemplary embodiments described above are considered preferred embodiments. However, the present invention should not be considered as limited to these exemplary preferred embodiments. For example, the preferred embodiments are based on understanding that accuracy and energy efficiency are inversely related to most configuration parameters. That is, a state with higher accuracy usually consumes higher energy as well. In the event it is impossible to meet both accuracy and energy targets together, an alternative embodiment might consider including a modification to settle at the lowest energy state where accuracy targets are met.

Additionally, although the embodiment exemplarily shown in FIG. 5 shows accuracy in the inner loop of the feedback mechanism, it is clear that the two parameters accuracy and energy could be reversed so that energy is evaluated in the inner loop. Additionally, it is noted that the present invention is intended to cover a feedback mechanism in which a single parameter, such as accuracy, is evaluated. Additionally, it should be clear that additional loops could be present in which other parameters are considered in controlling settings for the accelerator. Such modifications to the flowchart of FIG. 5 is also considered part of the present invention, as further described in the more generic flow 600 shown in FIG. 6.

In yet another modification, the present invention could be implemented in a cloud service where energy constraints would be less stringent. In such environment, the method of the present invention could be modified to use a cost-based metric, where one can trade off accuracy and cloud computing costs rather than accuracy and energy usage.

In yet another possible variation, speed might be considered as a tradeoff with accuracy, or a quality other than accuracy could be used as the highest priority for evaluating operation of the NNAccel.

Moreover, in some exemplary embodiments, the present invention can be considered as providing one or more aspects of the following:

- A hierarchy of memory elements (consisting of static and/or dynamic RAMs) where each element has knobs (voltage, refresh rate, latency) to dynamically trade off Bit-Error-Rate (BER) during each memory access, with energy, power, and/or performance;
- A hierarchy of computational stages such as layers of a deep neural network, where each layer can tolerate a certain BER to achieve energy savings such that the overall output quality metric (e.g., Inference accuracy) does not degrade below a specified threshold;
- A dynamic controller module, which can individually configure the aforementioned knobs for each computational stage to maximize energy subject to the specified output quality constraint; and/or
- A mechanism by which the error profile of one level of memory hierarchy could be used to determine the tunable parameters of the subsequent level of memory hierarchy, and vice versa.

Figure 6:
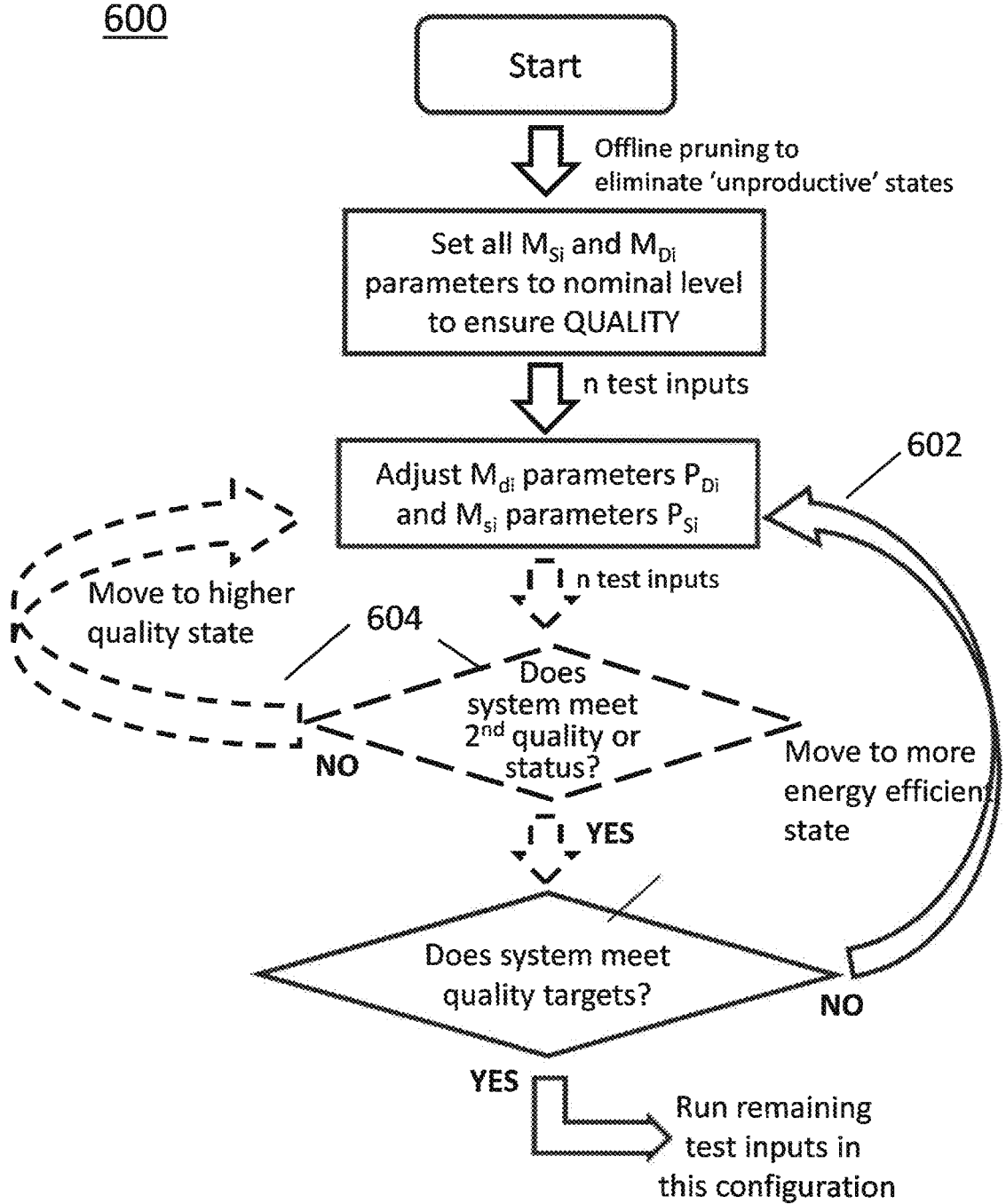
FIG. 6 show a flowchart of a more generic understanding of the present invention.

Thus, as explained above, the present invention should not be considered as confined to the exemplary embodiments described herein. FIG. 6 shows a more generic concept 600 considered as disclosed in the present invention. Specifically, the present invention is considered as describing that a NNAccel having at least one tunable parameter can be designed to include a closed loop control mechanism to adjust one or more of the tunable parameter(s) to achieve an operational quality or benefit. As shown exemplarily in FIG. 6, there is at least one control loop 602 based on detecting at least one operational status of the NNAccel. Thus, in the exemplary embodiment of FIG. 5, the operational status is quality and more specifically, accuracy, as detected using error rate. Another possible operational status might be, for example, speed, as detected by clock rate.

The dotted flow elements 604 in FIG. 6 demonstrates that the generic control flow might include inner loop(s) 604 based on a second quality or status, and it should be clear that additional inner loops are possible and that the single control loop 602 shown in FIG. 6 could include one or more parallel control loops not shown in this figure. It should also be clear that other qualities and/or metrics and other parameters related to NNAccels could be incorporated into the generic concept shown in FIG. 6 rather than the specific examples provided, and the present invention is considered as covering such other possible qualities, metrics, and parameters.

System Implementation

Figure 7:
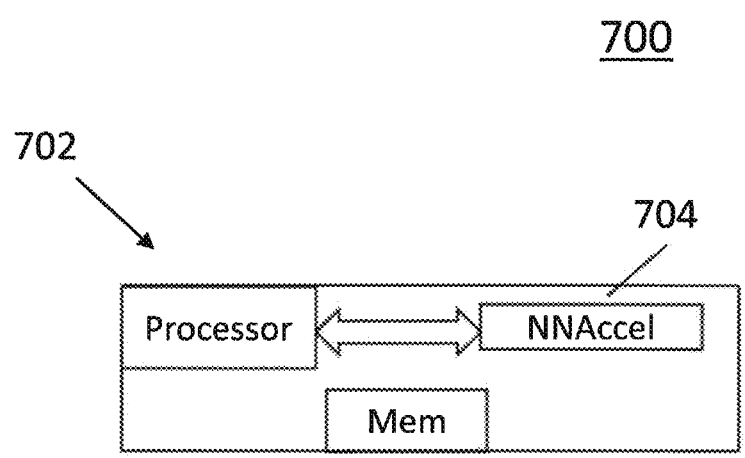
FIG. 7 shows an exemplary system implementation.

The present invention can be implemented in a number of ways, including, for example, an implementation 700 shown exemplarily in FIG. 7 in which a host computer 702 includes the accelerator 704 as a coprocessor. In this implementation, the host computer may serve as the accelerator controller, and might even provide any off-chip memory devices used by the accelerator.

Similarly, the host computer of FIG. 7 could be a server on a network such as the Internet, with the server providing access from users via the network. Accordingly, along this line, the present invention could be implemented as a cloud service, either offering the accelerator as a cloud service providing an application for users to define their own neural networks or as part of a cloud-based application involving Internet of Things (IoT) in which an accelerator provides parts of the calculations involved with the application, such as a distributed edge computing environment involving one or more IoT devices.

Therefore, although this disclosure includes below a detailed description on cloud computing, as follows, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 8:
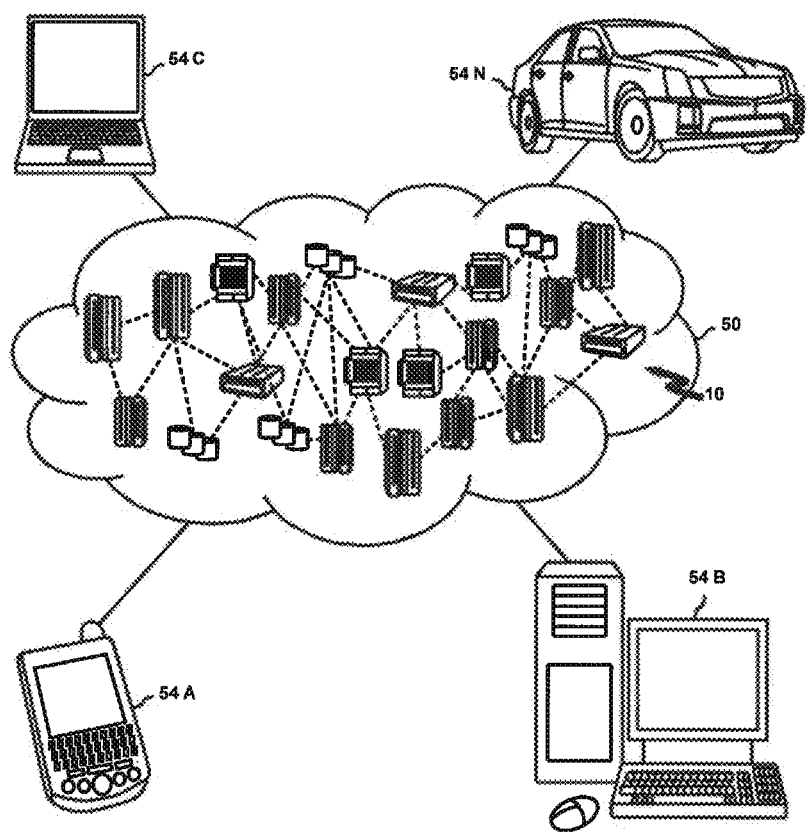
FIG. 8 shows a cloud computing environment according to an embodiment of the present invention.

Referring now to FIG. 8, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 8 are intended to be illustrative only and that computing nodes 10 and cloud computing environment 50 can communicate with any type of computerized device over any type of network and/or network addressable connection (e.g., using a web browser).

Figure 9:
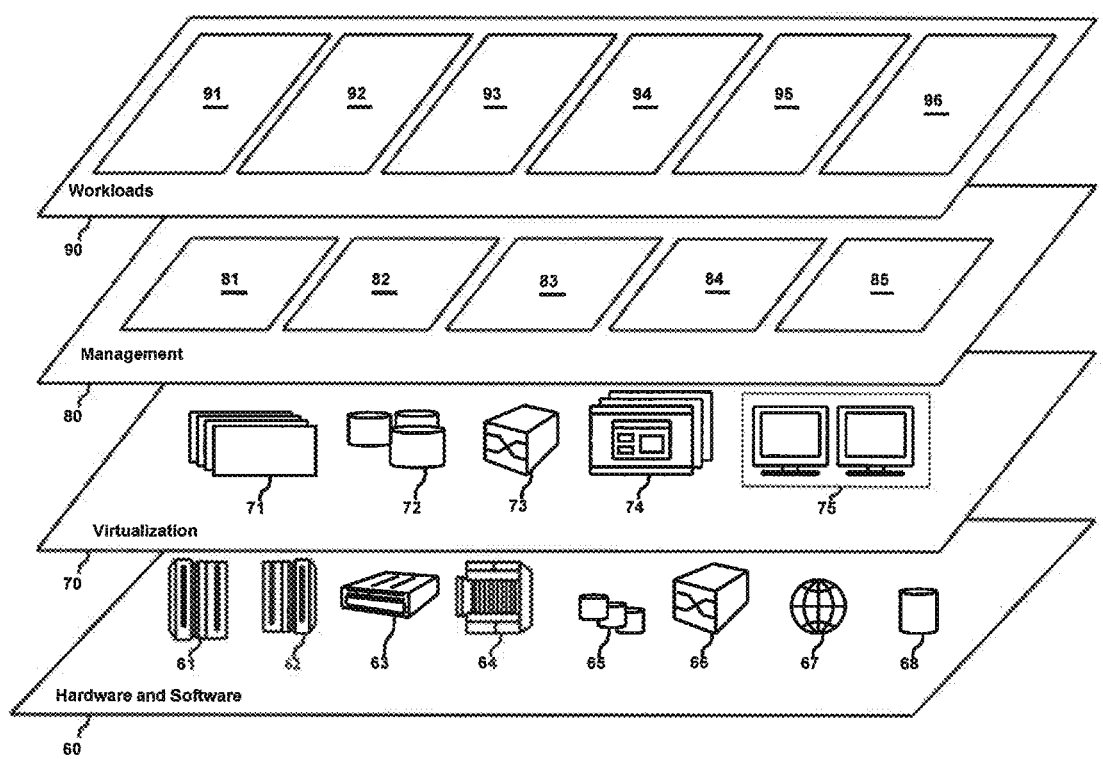
FIG. 9 depicts abstraction model layers according to an embodiment of the invention.

Referring now to FIG. 9, a set of functional abstraction layers provided by cloud computing environment 50 (FIG. 8) is shown. It should be understood in advance that the components, layers, and functions shown in FIG. 9 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture-based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include tasks related to the implementation of the present invention in which the neural network accelerator is incorporated, for example, into a cloud service or as a cloud service for distributed edge computing such as for a cognitive IoT device.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Further, it is noted that, Applicants' intent is to encompass equivalents of all claim elements, even if amended later during prosecution.

What is claimed is:

1. A method to optimize an operation in a Neural Network Accelerator (NNAccel) comprising a hierarchy of neural network layers as computational stages for the NNAccel and a configurable hierarchy of memory modules including one or more on-chip Static Random-Access Memory (SRAM) modules and one or more Dynamic Random-Access Memory (DRAM) modules, each memory module controlled by a plurality of operational parameters that are adjustable by a controller of the NNAcc, the method comprising:
  detecting bit error rates of memory modules currently being used by the NNAccel;
  determining, by the controller, whether the detected bit error rates are sufficient for a predetermined threshold value for an accuracy of a processing of the NNAccel; and
  dynamically changing, by the controller, one or more operational parameters of one or more memory modules to move to a higher accuracy state when the accuracy is below the predetermined threshold value.

2. The method of claim 1, wherein the NNAccel comprises an Artificial Intelligence (AI) accelerator.

3. The method of claim 1, wherein bit error rates are detected by counting errors from Error Correction Code (ECC) units in the memory modules.

4. The method of claim 1, wherein bit error rates are detected by one of a parity unit and a Built-In Self Test (BIST) unit.

5. The method of claim 1, wherein a metric used to quantify accuracy of the processing of the NNAccel comprises an inference accuracy for the NNAccel.

6. The method of claim 1, further comprising:
  when the NNAccel is determined to be operating within a predetermined accuracy, further determining, by the controller, whether the NNAccel is operating within a target energy level; and
  dynamically changing, by the controller, one or more operational parameters of one or more memory modules to move to a more energy efficient state when the NNAccel is operating outside the target energy level.

7. The method of claim 1, further comprising: storing a pruned list of combinations of parameter values in a non-volatile memory of the NNAccel, to provide a listing of possible runtime configurations for the NNAccel, each configuration in the listing identifying an indication of accuracy achievable with that configuration.

8. The method of claim 1, wherein at least one DRAM module comprises an off-chip DRAM module.

9. The method of claim 1, as implemented on a server on a network.

10. The method of claim 1, as implemented as part of a cloud service.

11. The method of claim 1, as implemented in a distributed edge computing scenario involving a cognitive processing for an Internet of Things (IoT) device.

12. A neural network accelerator (NNAccel), comprising:
  a hierarchy of neural network layers as comprising computational stages for the NNAccel; and
  a configurable hierarchy of memory modules including one or more on-chip Static Random-Access Memory (SRAM) modules and one or more Dynamic Random-Access Memory (DRAM) modules, each memory module controlled by a plurality of operational parameters that are adjustable by a controller of the NNAcc,
  wherein the controller controls the NNAccel by a control method comprising:
    detecting bit error rates of memory modules currently being used by the NNAccel;
    determining, by the controller, whether the detected bit error rates are sufficient to provide a predetermined threshold value an accuracy of a processing of the NNAccel; and
    dynamically changing, by the controller, one or more operational parameters of one or more memory modules to move to a higher accuracy state when the accuracy is below the predetermined threshold value.

13. The NNAccel of claim 11, wherein the controller comprises a Central Processing Unit (CPU) in a host computer associated with the NNAccel.

14. The NNAccel of claim 11, further comprising the controller as a component in the NNAccel.

15. The NNAccel of claim 11, wherein the one or more operational parameters adjustable by the controller comprises one or more of: Voltage (V), Frequency (f), Latency (L), and Refresh Rate (R) of the memory modules.

16. A method of controlling an operation in a Neural Network Accelerator (NNAccel) comprising a hierarchy of neural network layers as computational stages for the NNAccel and a configurable hierarchy of memory modules including one or more on-chip Static Random-Access Memory (SRAM) modules and one or more Dynamic Random-Access Memory (DRAM) modules, each memory module controlled by a plurality of operational parameters that are adjustable by a controller of the NNAcc, the method comprising:
  detecting a current value of a parameter reflecting a quality of a processing in the NNAccel;
  determining, by the controller, whether the quality is currently sufficient for a predetermined threshold quality; and
  dynamically changing, by the controller, one or more operational parameters to move to a higher quality state when the quality is below the predetermined threshold value.

17. The method of claim 16, wherein the quality is accuracy and the accuracy is detected using error rates of the memory modules.

18. The method of claim 16, further comprising optimizing the operation of the NNAccel by trading off the quality against at least one other operational performance parameter of the NNAccel processing.

19. The method of claim 18, wherein the at least one other operational performance parameter comprises one of: accuracy, an energy consumption of the NNAccel, a speed of the processing of the NNAccel, and a cost-based metric in a cloud computing scenario.

20. The method of claim 18, wherein the controller one of:
  attempts to optimize both the quality and the at least one other operational performance parameter while maintaining the quality above the predetermined threshold quality; and
  settles to a lowest value of the at least one other operational performance parameter for which the quality is maintained above the predetermined threshold quality if the at least one other operational performance parameter cannot be optimized.

* * * * *